United States Patent [19]
Nevill

[11] Patent Number: 5,984,190
[45] Date of Patent: Nov. 16, 1999

[54] METHOD AND APPARATUS FOR IDENTIFYING INTEGRATED CIRCUITS

[75] Inventor: Leland R. Nevill, Boise, Id.

[73] Assignee: Micron Technology, Inc., Boise, Id.

[21] Appl. No.: 08/857,100

[22] Filed: May 15, 1997

[51] Int. Cl.⁶ .................................................. G06K 19/06
[52] U.S. Cl. ........................... 235/492; 235/494; 438/10; 438/18
[58] Field of Search .................... 235/492, 493, 235/494, 487; 438/10, 18

[56] References Cited

U.S. PATENT DOCUMENTS

| | | | |
|---|---|---|---|
| 4,967,381 | 10/1990 | Lane et al. | 364/551.01 |
| 5,103,166 | 4/1992 | Jeon et al. | 324/158 R |
| 5,226,118 | 7/1993 | Baker et al. | 395/161 |
| 5,294,812 | 3/1994 | Hashimoto et al. | 257/65 |
| 5,301,143 | 4/1994 | Ohri et al. | 365/96 |
| 5,313,174 | 5/1994 | Dubois et al. | 235/454 |
| 5,380,998 | 1/1995 | Bossen et al. | 235/494 |
| 5,389,770 | 2/1995 | Ackley | 235/462 |
| 5,420,796 | 5/1995 | Weling et al. | 364/468 |
| 5,434,870 | 7/1995 | Benton et al. | 371/37.1 |
| 5,467,304 | 11/1995 | Uchida et al. | 365/174 |
| 5,511,005 | 4/1996 | Abbe et al. | 364/552 |
| 5,787,174 | 7/1998 | Tuttle | 380/23 |

FOREIGN PATENT DOCUMENTS

| | | | |
|---|---|---|---|
| 0 488 053 A1 | 6/1992 | European Pat. Off. | H01L 23/544 |
| 0 578 410 A2 | 1/1994 | European Pat. Off. | G06F 11/00 |
| 3138085 A1 | 4/1983 | Germany | H01L 21/66 |
| 3226733 A1 | 7/1983 | Germany | H01L 23/50 |
| 2244339 | 11/1991 | United Kingdom | G01R 31/28 |

*Primary Examiner*—Donald Hajec
*Assistant Examiner*—Daniel St. Cyr
*Attorney, Agent, or Firm*—Seed and Berry LLP

[57] ABSTRACT

An integrated circuit and method for identifying same is described. The integrated circuit includes a programmable identification circuit for storing electronic identification information. The integrated circuit also includes an optical identification mark displaying a machine-readable optical identification code which corresponds with the electronic identification information stored in the identification circuit. The data encoded in the optical identification code may be identical with that of the electronic identification information. Alternatively, a look-up table or other correlating means may be employed to associate the optical identification code with the electronic identification information. The integrated circuit is packaged in a housing, and another optical identification mark is placed on an external surface of the housing. This second optical identification mark displays a machine-readable optical identification code which is identical or correlated to the electronic identification information stored in the identification circuit and/or the optical identification code displayed by the optical identification mark on the integrated circuit. Consequently, convenient and traceable identification of individual integrated circuits is provided during and after manufacture.

22 Claims, 1 Drawing Sheet

METHOD AND APPARATUS FOR IDENTIFYING INTEGRATED CIRCUITS

TECHNICAL FIELD

This invention relates generally to integrated circuits, and more particularly to identification information for integrated circuits.

BACKGROUND OF THE INVENTION

Typically, many identical integrated circuits are constructed on a single wafer of semiconductor material, such as monocrystalline silicon or gallium arsenide. The portion of the wafer occupied by a single one of the integrated circuits is called a die. After completed fabrication of the integrated circuits, a series of tests (known as Probe) is performed in which the function of each die is tested. The test data collected for each die is used in subsequent assembly/packaging steps to ensure that only properly functioning die are packaged as integrated circuit chips.

Following the Probe test, the individual dies are separated from one another, and each properly functioning die is encapsulated (usually in plastic or ceramic) in a package having electric leads to form an integrated circuit chip. Subsequently, a series of testing operations is performed for each of the integrated circuit chips, with test data collected for each of the chips.

In order to properly correlate the various test results with the appropriate die or dies, accurate identification of each of the dies is required, both before and after packaging as an integrated circuit chip. The ability to identify particular dies can also be important following completed manufacture of the integrated circuit chip. For example, when an integrated circuit chip unexpectedly fails during later use, the manufacturer of the chip may wish to identify other potentially failing chips and the users of those chips.

Many of today's integrated circuits provide electronically readable identification information which is programmed into the integrated circuit itself—usually during Probe testing. Also, chip packages usually have an ink or laser-scribed mark which provides some useful information, such as date and country of manufacture, product and package types, speed and other test parameters, and manufacturing lot identification. However, information uniquely identifying the particular integrated circuit within a chip is included only in the electronically readable identification information.

The electronically readable identification information is usually available only during those manufacturing procedures in which the integrated circuit is electrically tested. Also, retrieving the electronically readable identification information is usually done with a relatively sophisticated semiconductor testing apparatus, which necessarily makes physical contact with the integrated circuit chip in order to access the identifying information. There exist a number of manufacturing process steps during which such physical contact does not occur, and hence traceable identification of the individual integrated circuit chips through the various manufacturing processes is quite difficult. Also, once the manufacturer ships the integrated circuit chip to a customer, the unique identification information is not readily available.

SUMMARY OF THE INVENTION

A method of identifying an integrated circuit is provided in which the integrated circuit is both programmed with electronic identification information and marked with a corresponding machine-readable optical identification code. The integrated circuit may be marked with an adhesive label, inscribed with a laser, or marked in any of a variety of suitable ways of displaying machine-readable optical identification codes. The integrated circuit may include a plurality of programmable links which are programmed to store the electronic identification information, or include any of a variety of suitable adapted circuits for non-volatile data storage.

The method further includes the steps of reading the optical identification code and associating it with the corresponding electronic identification information. A look-up table or other suitable correlating means may be used for performing the association step. Alternatively, the optical identification code may encode exactly the same data values as the electronic identification information.

DETAILED DESCRIPTION OF THE INVENTION

In the following description, certain specific details are set forth in order to provide a thorough understanding of embodiments of the present invention. It will be clear, however, to one skilled in the art that the present invention may be practiced without these details. In other instances, well-known circuits and structures have not been shown in detail in order not to unnecessarily obscure the description of the embodiments of the invention.

Figure 1:
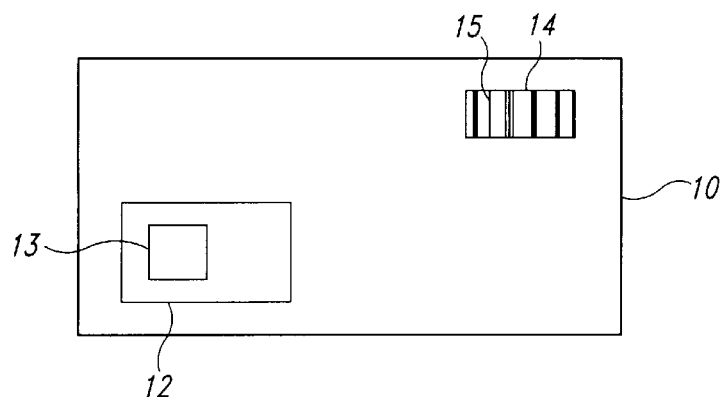
FIG. 1 is a block diagram depicting an integrated circuit which includes an identification circuit and a machine-readable optical mark.

FIG. 1 depicts an integrated circuit 10, which may be any of a wide variety of integrated circuits fabricated by conventional or newly developed methods. The integrated circuit 10 includes a programmable identification circuit 12 having a bank of programmable links 13, for storing electronic identification information uniquely identifying the integrated circuit. The identification circuit 12 can be any of a variety of circuits suitable for such purpose, whether currently well known or subsequently developed. The programmable links can be fuses, antifuses, or any of a wide variety of circuit elements suitable for non-volatile data storage, whether currently well known or subsequently developed. The method by which the identification circuit 12 is programmed to store the electronic identification information, as well as the method by which such information is retrieved from the identification circuit, can be any of a wide variety of methods for such purpose, whether currently well known or subsequently developed. For example, U.S. Pat. No. 5,301,143 to Ohri et al., which is incorporated herein by reference, describes an example programmable identification circuit 12 and methods for storing/retrieving information to/from same.

The integrated circuit 10 also includes a machine-readable optical identification mark 14. The identification mark 14 may be an adhesive label, a laser-scribed mark, or any of a wide variety of suitable marks. The identification mark 14 displays an optical identification code 15 which corresponds with the electronic identification information stored in the programmable identification circuit 12. The optical identification code 15 can be any of a wide variety of machine-readable optical identification codes, whether currently well known or subsequently developed. The optical identification code 15 can be read by any of a wide variety of methods and with corresponding ones of a wide variety of optical code readers, whether currently well known or subsequently developed. For example, a particular optical identification code and a method and apparatus for reading and decoding the code are described in U.S. Pat. No. 5,389,770 to Ackley, which is incorporated herein by reference.

Figure 2:
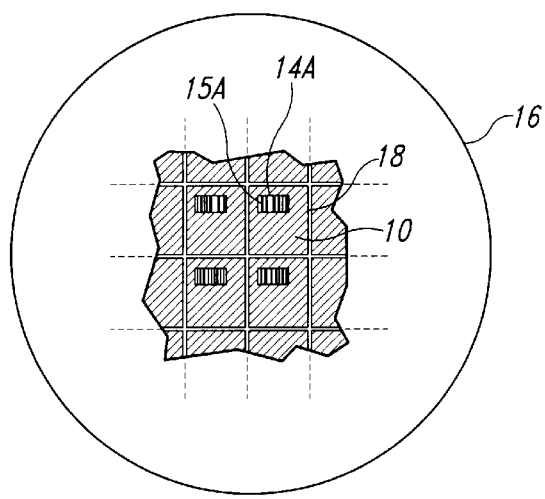
FIG. 2 depicts a semiconductor wafer including a plurality of dies, each of which has a machine-readable optical mark.
Figure 3:
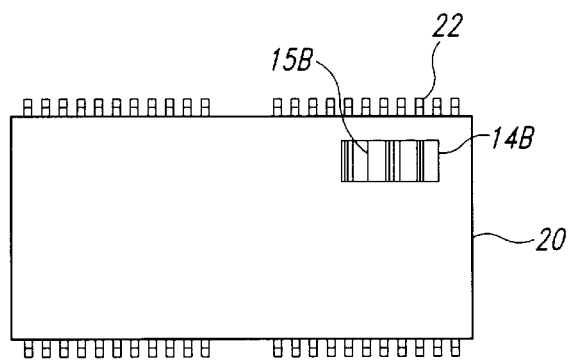
FIG. 3 depicts a packaged integrated circuit chip which has a machine-readable optical mark.

FIG. 2 depicts a semiconductor wafer 16 on which a plurality of integrated circuits 10 have been constructed, each on a corresponding one of a plurality of semiconductor dies 18. On each of the dies 18 is a corresponding one of a plurality of the optical identification marks 14A, each having an optical identification code 15A which corresponds with the electronic identification information stored within the identification circuit 12 (see FIG. 1). FIG. 3 depicts a packaged integrated circuit chip 20, within which one of the dies 18 (see FIG. 2) is encapsulated. The integrated circuit 10 (see FIGS. 1 and 2) is electrically accessible via a plurality of electric leads 22. An outer surface of the packaged chip 20 is marked with an optical identification mark 14B having an optical identification code 15B which corresponds with the electronic identification information stored within the identification circuit 12 (see FIG. 1). Note that distinct reference numerals are used to identify the optical identification marks and codes in FIGS. 1–3, indicating that various non-identical identification marks and codes may be used at different stages of the manufacturing process.

Typically, the electronic identification information is programmed into the identification circuit 12 during Probe testing of the various dies 18 included in the wafer 16. One or more of the identification marks 14–14B could then be produced to include an optical identification code which encodes data that is identical to the data stored in the identification circuit 12. In other words, the electronically accessible pattern of 1's and 0's stored in the identification circuit 12 is the same as the optically accessible pattern of 1's and 0's encoded in one or more of the identification marks 14–14B. Alternatively, one or more of the identification marks 14–14B can be correlated, via a look-up table or other conventional correlation means, with the particular electronic identification data stored in the identification circuit 12—a more flexible approach than requiring identical data.

Those skilled in the art will appreciate a number of advantages achieved by the above-described embodiments of the present invention. Conventionally, integrated circuits have included only the electronically accessible identification information, as well as visual marking information intended for human eyes. Thus accurate identification of individual integrated circuits has been available only during manufacturing processes in which the integrated circuit is electrically accessed. In contrast, the present invention provides identification marks having an optical identification code associated with the electronic identification information, thereby providing convenient, accurate and traceable identification of individual integrated circuits during and following the manufacturing process. Also, the ability to optically identify the integrated circuit avoids the need for physical contact, thereby minimizing the possibility of damage to the integrated circuit by the act of electronically reading the identification data—a common concern with current technology.

As stated above, the optical identification marks 14–14B can be any of a wide variety of such marks, and the method and apparatus for encoding optical identification information and reading such information can be any of a wide variety of suitable ones for such purpose. Similarly, the identification circuit 12 can be any of a wide variety of suitably adapted circuits, and the particular methods for programming and retrieving electronic identification information thereto and therefrom can be any of a wide variety of suitably adapted methods. It is the combination of both electrically accessible identification information and associated machine-readable optical identification codes which provides traceability of the integrated circuit through the manufacturing process, as well as after it has been shipped to a customer.

While certain embodiments of the invention have been described for purposes of illustration, various modifications may be made without deviating from the spirit and scope of the invention. Numerous variations are well within the scope of this invention, and accordingly, the invention is not limited except by the appended claims.

I claim:

1. A method of identifying a plurality of substantially identical integrated circuits formed on a common substrate, comprising the steps of:

programming each of the integrated circuits with respective electronic identification information distinguishing the integrated circuits from one another; and marking each of the integrated circuits with respective optical identification code which corresponds with the respective electronic identification information;

reading the optical identification code on each of the integrated circuits; and accessing a lookup table to associate the optical identification code on each of the integrated circuits with the corresponding electronic identification information.

2. The method of claim 1 wherein the step of programming each of the integrated circuits with electronic identification information includes the step of programming one of a plurality of programmable links.

3. The method of claim 1 wherein the step of marking each of the integrated circuits with optical identification code includes the step of placing an adhesive label on each of the integrated circuits.

4. The method of claim 1 wherein the step of marking each of the integrated circuits with optical identification code includes the step of inscribing a symbol on each of the integrated circuits.

5. The method of claim 1 wherein the step of marking each of the integrated circuits includes the step of marking respective portions of the substrate on which the integrated circuits are formed.

6. In a plurality of substantially identical integrated circuits formed on a common substrate, each of the integrated circuits including a programmable circuit for storing respective electronically readable identification code which distinguishes the integrated circuits from one another, a method of identifying the integrated circuits, comprising the steps of:

marking each of the integrated circuits with respective optical identification code;

accessing a lookup table to associate the optical identification code on each of the integrated circuits with the respective electronically readable identification code and reading the optical identification code on each of the integrated circuits.

7. The method of claim 6 wherein the step of associating the optical identification code on each of the integrated circuits with the respective electronically readable identification code includes the steps of:

reading the electronically readable identification code stored in each of the integrated circuits;

reading the optical identification code marked on each of the integrated circuits; and correlating the read electronically readable identification code with the read optical identification code for each of the integrated circuits.

8. The method of claim 6 wherein the step of associating the optical identification code on each of the integrated circuits with the respective electronically readable identification code includes the step of encoding identical data in the optical and electronically readable identification codes.

9. The method of claim 6 wherein the step of marking each of the integrated circuits includes the step of marking respective portions of the substrate on which the integrated circuits are formed.

10. A wafer comprising a plurality of dies, each die including an integrated circuit having a programmable identification circuit that stores identification data, and each die having an optical identification mark positioned thereon and encoding information corresponding to the identification data, optical identification mark on each die being accessed through a lookup table to correspond to the electronic identification information.

11. The wafer of claim 10 wherein the programmable identification circuit includes a plurality of programmable links.

12. The wafer of claim 10 wherein the optical identification mark encodes information identical to the identification data.

13. The wafer of claim 10 wherein the identification data uniquely distinguishes each of the dies.

14. A plurality of integrated circuit chips, each comprising:

a housing;

an integrated circuit enclosed within the housing and including an identification circuit that stores identification data distinguishing each of the integrated circuit chips from one another; and an optical mark positioned on an exterior surface of the housing and encoding identification information being accessed through a lookup table to correspond to the identification data.

15. The integrated circuit chips of claim 14, further comprising electrical contacts connected to said housing and adapted to provide electrical connection between the integrated circuit and circuitry external to the housing.

16. The integrated circuit chips of claim 14 wherein the optical mark is a first optical mark encoding first identification information, and further comprising a second optical mark positioned on the integrated circuit enclosed within the housing and encoding second identification information corresponding to the identification data.

17. The integrated circuit chips of claim 16 wherein the first identification information is identical to the second identification information.

18. The integrated circuit chips of claim 14 wherein the identification information is the same as the identification data.

19. A method of identifying a plurality of substantially identical integrated circuits formed on a common substrate, each of the integrated circuits being formed on a respective one of a plurality of substrate dies, the method comprising:

programming each of the plurality of integrated circuits with respective electronic identification information for each of the integrated circuits; and marking each of the dies with optical identification code which corresponds with the respective electronic identification information;

reading the optical identification code on each of the integrated circuits;

reading the electronic identification information from each of the integrated circuits; and accessing a lookup table to associate the optical identification code on each of the integrated circuits with the corresponding electronic identification information.

20. The method of claim 19 wherein the electronic identification information is distinct for each of the integrated circuits.

21. The method of claim 19 wherein the optical identification code is distinct for each of the dies.

22. The method of claim 19 wherein the optical identification code and the electronic identification information include identical data.

* * * * *

UNITED STATES PATENT AND TRADEMARK OFFICE
CERTIFICATE OF CORRECTION

PATENT NO. : 5,984,190  
DATED : November 16, 1999  
INVENTOR(S) : Laland R. Nevill It is certified that error appears in the above-identified patent and that said Letters Patent is hereby corrected as shown below:

Additional U.S. PATENT DOCUMENTS

| | | | |
|---|---|---|---|
| 4,904,853 | 2/1990 | Yokokawa | 235/487 |
| 5,129,974 | 6/1992 | Aurenius | 283/81 |
| 5,360,747 | 11/1994 | Larson et al. | 437/8 |
| 5,641,164 | 6/1997 | Doederlein et al. | 273/237 |
| 5,742,526 | 4/1998 | Voshell et al. | 235/380 |
| 5,743,801 | 4/1998 | Welander | 463/43 |
| 5,748,731 | 5/1998 | Shepherd | 380/4 |
| 5,801,067 | 9/1998 | Shaw et al. | 438/15 |

Signed and Sealed this

Nineteenth Day of February, 2002

Attest:

JAMES E. ROGAN  
Attesting Officer  Director of the United States Patent and Trademark Office